Oct. 25, 1960 B. CORNELISON ET AL 2,958,021
COOLING ARRANGEMENT FOR TRANSISTOR
Filed April 23, 1958
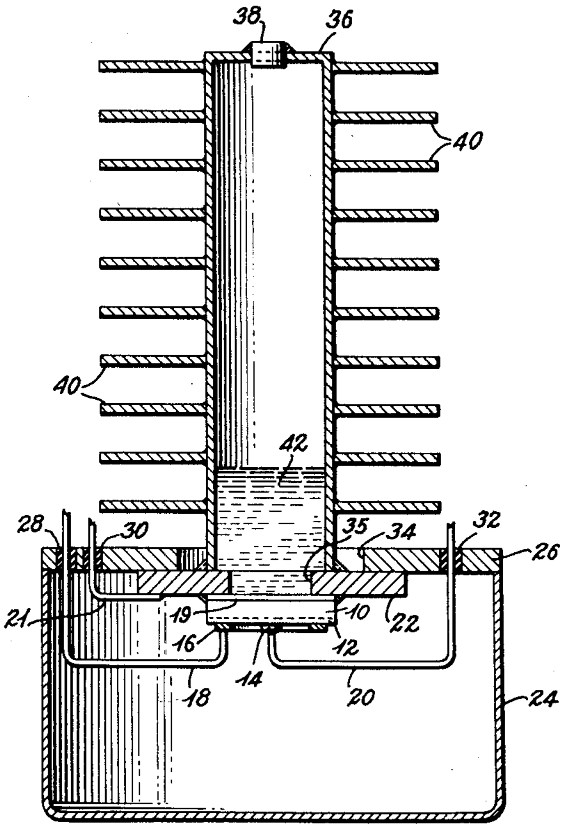
INVENTORS
BOYD CORNELISON AND
ELMER A. WOLFF, JR.
BY Stevens, Davis, Miller & Mosher
ATTORNEYS United States Patent Office 2,958,021
Patented Oct. 25, 1960

2,958,021

COOLING ARRANGEMENT FOR TRANSISTOR

Boyd Cornelison, Dallas, and Elmer A. Wolff, Jr., Richardson, Tex., assignors to Texas Instruments Incorporated, Dallas, Tex., a corporation of Delaware Filed Apr. 23, 1958, Ser. No. 730,397

5 Claims. (Cl. 317—234)

The present invention relates to a power transistor assembly and to a method for cooling a power transistor.

One of the critical factors which limits the power handling capabilities of a transistor is its ability to dissipate heat rapidly and efficiently. Excessive temperatures may impair the characteristics of a transistor and may even cause failure if the transistor is subjected to heavy electrical loads while at elevated temperatures. The problem of heat dissipation is thus recognized by all as of paramount importance and many special provisions have been suggested to improve the heat dissipation at the operational current load. Despite the advancements to date, there still remains a strong demand for further improvements which can dissipate large amounts of heat expeditiously.

It was in response to this strong demand that this invention was conceived. According to the invention a new and unique arrangement is provided which functions on a liquid-vapor heat exchange cycle to dissipate exceptional amounts of heat.

Accordingly, it is the object of the present invention to provide a novel assembly including a power transistor which will function to dissipate large amounts of heat expediently and which constitutes a departure from prior structures intended for this purpose.

It is a further object of the present invention to provide an improved transistor assembly characterized by a unique cooling system whereby the transistor when operated will not be subjected to excessive temperatures which otherwise would cause a breakdown of the unit.

It is a further object to provide a novel method for cooling a power transistor.

Other and further objects of the present invention will become more fully apparent from the following detailed description when taken in conjunction with the drawing which shows in section a power transistor provided with a cooling device in accordance with the present invention.

Referring now to the drawings there will be described a preferred form of the transistor assembly of the present invention. As will be evident the unit is composed of a semiconductor wafer 10 of silicon containing an N type conductivity producing impurity. A P type impurity has been diffused into one surface of the wafer 10 to form a layer 12 of P type conductivity and the base-collector junction. A dot 14 of suitable material is alloyed into the layer 12 to form the base-emitter junction of the transistor. A ring 16 of nickel is attached to layer 12 and forms the base contact. Base lead 18 is soldered to ring 16. Emitter lead 20 is soldered to the dot 14. A layer 19 is attached to the wafer 10 and is soldered to an annular copper header 22 which acts as a heat sink. Collector lead 21 is attached to copper header 22.

The transistor is enclosed in a can 24 which is welded or otherwise attached to an annular support plate 26. Leads 18, 20 and 22 extend through the plate 26 and are insulated therefrom by pass through insulators 28, 30 and 32.

The copper header 22 is attached to the annular plate 26 by solder and the openings 34 and 35 in plate 26 and header 22 respectively, are such that the collector side of the wafer is virtually exposed through the opening 35.

A tube 36, having a diameter somewhat less than the opening 34, is soldered to the upper surface of the copper header 22. The tube 36 is sealed at its upper end by suitable means such as a plug 38 which may be threaded or soldered into the tube 36. The tube 36 is also provided with a plurality of radial cooling fins 40 on its outer circumference and contains a suitable fluid 42 therein preferably under pressure. Any suitable fluid can be used. A refrigerant such as a low boiling liquid which can be rapidly vaporized by the heat given off by the transistor unit is desirable. Freon CC/4 and alcohol are particularly suitable. Freon is the commercial name for dichlorodifluoromethane and is a noncorrosive nonflammable gas boiling at −29° C. Other of the halogenated hydrocarbons containing one or more fluorine atoms are likewise suitable. In assembling the device, the liquid 42 is poured into the tube 36 under pressure after evacuating the tube and plug 38 is then replaced and soldered to seal the tube.

In operation, heat given off by the transistor passes by thermal conduction to the liquid 42 in the tube 36. As the liquid 42 absorbs heat, it will vaporize and the vapors will pass upwardly. The vapors will give up their heat to the heat fins 40 as they rise, will condense and recirculate back to the liquid 42. Thus, it can be readily seen that the arrangement provides an extremely convenient and efficient way of conducting heat rapidly away from the transistor and transferring the heat to the fins 40 on the tubing and ultimately to the surrounding atmosphere.

The copper header 22 in place of being annular can be solid and serve as a heat exchange between the transistor and liquid 42.

It will be obvious to those skilled in the art that various changes may be made without departing from the spirit of the invention and therefore the invention is not limited to what is shown in the drawings and described in the specification, but rather encompasses all forms of the invention as defined in the appended claims.

What is claimed is:

1. A transistor assembly comprising a transistor element, first means defining with said transistor element a first enclosed chamber, second means defining with said transistor element a second enclosed chamber, said chambers being non-communicating, electrical connections to said transistor element disposed wholly in said first chamber, and a volatile liquid coolant confined in said second chamber in heat exchange relation with said transistor element whereby heat given off by said transistor element is absorbed by said liquid coolant causing vaporization thereof.

2. A transistor assembly as defined in claim 1 wherein said second means includes cooling fins.

3. A transistor assembly comprising an annulus of high thermal conductivity, a transistor element mounted on said annulus closing the opening therein, first means defining with said annulus and said transistor element a first enclosed chamber, second means defining with said annulus and said transistor element a second enclosed chamber, said chambers being non-communicating, electrical connections to satd iransistor element disposed wholly in said first chamber, and a volatile liquid coolant confined in said second chamber in heat exchange relation with said transistor element whereby heat given off by said transistor element is absorbed by said liquid coolant causing vaporization thereof.

4. A transistor assembly as defined in claim 3 wherein said second means includes cooling fins.

5. The combination comprising an annulus of high thermal conductivity, a transistor wafer mounted on one side of said annulus with its collector region closing the opening thereof, a tube closed at one end and open at the other having its open end attached to the other side of said annulus in registry with the opening therein, said tube defining cooling fins and containing a volatile liquid coolant, electrical connections to said transistor wafer, and means enclosing said transistor wafer.

References Cited in the file of this patent

UNITED STATES PATENTS

| | | |
|---|---|---|
| 2,288,341 | Addink | June 30, 1942 |
| 2,862,158 | Stelmak et al. | Nov. 25, 1958 |
| 2,883,591 | Camp | Apr. 21, 1959 |
| 2,886,746 | Saby | May 12, 1959 |

FOREIGN PATENTS

| | | |
|---|---|---|
| 51,318 | Holland | Oct. 15, 1941 |